United States Patent [19]
Chu et al.

[11] Patent Number: 5,712,188
[45] Date of Patent: Jan. 27, 1998

[54] FABRICATION METHOD OF POLARIZATION-CONTROLLED SURFACE-EMITTING LASER DIODE USING TILTED-CAVITY

[75] Inventors: HyeYong Chu, Yusong-ku; ByuengSu Yoo, Seo-ku; HyoHoon Park, Yusong-ku; MinSoo Park, Yusong-ku, all of Rep. of Korea

[73] Assignee: Electronics and Telecommunications Research Institute, Daejeon, Rep. of Korea

[21] Appl. No.: 641,531

[22] Filed: May 1, 1996

[30] Foreign Application Priority Data

Dec. 21, 1995 [KR] Rep. of Korea ............... 95-53677

[51] Int. Cl.⁶ ........................................... H01L 21/20
[52] U.S. Cl. ................... 437/129; 437/15; 437/127; 437/905; 148/DIG. 95; 148/DIG. 99
[58] Field of Search .................... 437/127, 129, 437/905; 148/DIG. 95, DIG. 99; 432/15

[56] References Cited

U.S. PATENT DOCUMENTS

| | | | |
|---|---|---|---|
| 4,080,245 | 3/1978 | Yamanaka et al. | 437/905 |
| 4,248,688 | 2/1981 | Gartner et al. | 204/192 |
| 4,354,898 | 10/1982 | Coldren et al. | 156/647 |
| 4,397,711 | 8/1983 | Donnelly et al. | 156/643 |
| 4,547,956 | 10/1985 | Bouadma et al. | 29/569 |
| 4,865,684 | 9/1989 | Bouadma | 437/129 |
| 4,873,696 | 10/1989 | Coldren et al. | 372/96 |
| 5,115,442 | 5/1992 | Lee et al. | 437/129 |
| 5,149,670 | 9/1992 | Isshiki | 437/129 |
| 5,256,580 | 10/1993 | Gaw et al. | 437/129 |
| 5,256,596 | 10/1993 | Ackley et al. | 437/129 |
| 5,270,245 | 12/1993 | Gaw et al. | 437/129 |
| 5,272,109 | 12/1993 | Motoda | 437/129 |
| 5,314,838 | 5/1994 | Cho et al. | 437/105 |
| 5,336,635 | 8/1994 | Anayama et al. | 437/129 |
| 5,346,854 | 9/1994 | Ahn et al. | 437/129 |
| 5,376,583 | 12/1994 | Northrup et al. | 437/129 |
| 5,416,044 | 5/1995 | Chino et al. | 148/DIG. 95 |
| 5,492,607 | 2/1996 | Yap | 437/129 |
| 5,538,918 | 7/1996 | Haase et al. | 437/129 |

FOREIGN PATENT DOCUMENTS

0312401   4/1989   European Pat. Off. ............. 437/129

OTHER PUBLICATIONS

*IEEE Photonics Technology Letters*, vol. 6, No. 1, Jan. 1994, article entitled "Control of Vertical–Cavity Laser Polarization With Ansiotropic Transverse Cavity Geometries", by Kent D. Choquette and R. E. Leibenguth, pp. 40–332.

*IEEE Journal of Selected Topics in Quantum Electronics*, vol. 1, No. 2, Jun. 1995, article entitled "Polarization Control of Vertical–Cavity Surface–Emitting Lasers Using a Birefrigerant Metal/Dielectric Polarizer Loaded on Top Distributed Bragg Reflector", by Toshikazu Mukaihhara et al, pp. 667–673.

*Primary Examiner*—Jey Tsai
*Assistant Examiner*—Long Pham
*Attorney, Agent, or Firm*—Antonelli, Terry, Stout & Kraus, LLP.

[57] ABSTRACT

A fabrication method of a surface-emitting laser diode which permits easy control of polarization in a desired direction is disclosed. The laser emits light from an emitting surface having a sidewall inclined with respect to a normal to the emitting surface. An ion beam is provided for etching the inclined sidewall of the laser and a substrate is positioned having a face which is formed into the emitting surface in the ion beam to cause the ion beam to intercept a sidewall of the substrate to form the inclined sidewall. The face is tilted about either one of a [110] or a [1$\bar{1}$0] direction. An angle is formed ranging between 5° and 45° measured between the inclined sidewall and the [001] direction.

4 Claims, 4 Drawing Sheets

BEAM DIRECTION

ETCHING BY TILTING WAFER
ABOUT [110] DIRECTION
α=5-45°

BEAM DIRECTION

ETCHING BY TILTING WAFER
ABOUT [1̄10] DIRECTION
α=5-45°

AFTER ETCHING

AFTER ETCHING

FABRICATION METHOD OF POLARIZATION-CONTROLLED SURFACE-EMITTING LASER DIODE USING TILTED-CAVITY

BACKGROUND OF THE INVENTION

A. Field of the Invention

The present invention relates to a fabrication method of a vertical-cavity surface-emitting laser diode. More particularly, the present invention relates to a fabrication method of a surface-emitting laser diode obtained by tilted-etching of a cavity toward a direction of [110] or [1̄10] to control polarization.

The polarization characteristics of a vertical-cavity surface-emitting laser diode can be classified into two types: one is that a direction of an electric field is arranged in the direction of [110] and the other is that the direction of the electric field is arranged in the direction of [1̄10].

The control of polarization can enhance the efficiency of optical interconnects, optical communications, and optical processing.

B. Description of the Prior Art

As conventional polarization control methods for vertical-cavity surface-emitting laser diodes, two methods have been proposed: The first one is that a cavity is etched with anisotropic transverse geometries such as an ellipse or a dumbell shape described by Choquette et al in Journal of IEEE, 1994, "Control of Vertical-Cavity Laser Polarization with Anisotropic transverse Cavity Geometries". The second one is that a minute line is engraved on a laser diode emitting surface using an electron-beam minute pattern described by Mukaihara et al in Journal of IEEE, 1995, "Emitting Lasers Using a Birefringent Metal/Dielectric Polarizer Loaded on Top Distributed Bragg Reflector".

However, the above first method and the second method have a disadvantage in that the fabrication process is difficult due to the use of the electron-beam minute pattern.

SUMMARY OF THE INVENTION

The object of the present invention is to provide a fabrication method of a surface-emitting laser diode which can easily control polarization in a desired direction by titled-etching of a cavity toward a direction of [110] or [1̄10].

Thus, a user can control the polarization in the desired direction by selecting one of two directions of a tilted direction of a cavity as [110] and [1̄10].

Another object of the present invention is to provide a fabrication method of a bottom emitting laser diode having a tilted direction of a cavity toward [110] or [1̄10].

Still, another object of the present invention is to provide a fabrication method of a top emitting laser diode having a tilted direction of a cavity of [110] or [1̄10].

To achieve the object of the invention, as embodied and broadly described herein, the cavity is formed in a direction of [110] or [1̄10] after tilting a substrate with an angle of 5 to 45 degrees relative to an ion beam direction in a fabrication method of a vertical cavity type surface-emitting laser diode.

To achieve another object of the present invention, the fabrication method of a vertical cavity type surface-emitting laser diode comprises the steps of forming a bottom mirror layer, an active layer and a top mirror layer on a GaAs substrate in turn; forming a metal layer on the top mirror layer as an etching mask material and forming a metal mask pattern by patterning by photolithography; and ion etching after tilting an exposed top mirror layer and an active layer with an angle of 5 to 45 degrees in the direction of [110] or [1̄10] relative to an ion beam direction from which ions for the ion etching are provided using the metal mask pattern as an etching mask for a bottom generation material.

To achieve another object of the present invention, the fabrication method of a vertical cavity type surface-emitting laser diode comprises the steps of forming a bottom mirror layer, an active layer, a top mirror layer and a protection film on a GaAs substrate in turn; forming a photoresist pattern having a predetermined width after forming the protection layer and a photoresist, and exposing the photoresist pattern to light and developing the photoresist pattern; patterning the exposed protection layer using the photoresist pattern as an ion etching mask; etching the top mirror layer exposed by the protection layer to a predetermined depth with an angle of 5 to 45 degrees in the direction of [110] or [1̄10] relative to an ion beam direction from which ions for the ion etching are provided; and forming an ion-implanted region in the active layer by injecting an dopant using the photoresist pattern and the protection layer as an ion-implanted mask.

The objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

BRIEF DESCRIPTION OF THE DRAWINGS

The accompanying drawings illustrate embodiments of the invention and, together with the description, serve to explain the principles of the invention. In the drawings.

DESCRIPTION OF THE PREFERRED EMBODIMENTS

Reference will now be made in detail to preferred embodiment of the present invention, an example of which is illustrated in the accompanying drawings. Wherever possible, the same reference numbers will be used throughout the drawings to refer to the same or like parts.

A surface-emitting laser diode of the present invention which can control polarization by forming a cavity by etching after tilting (rotation about selected directions [110] or [1̄10]) a substrate can be fabricated in two types, that is, a bottom emitting laser diode and a top emitting laser diode. The steps of the fabrication processes of each type are illustrated in FIGS. 1A to 1B and FIGS. 2A to 2D respectively.

A first preferred embodiment of the present invention will be explained hereinafter with reference to accompanying drawings.

Figure 1A:
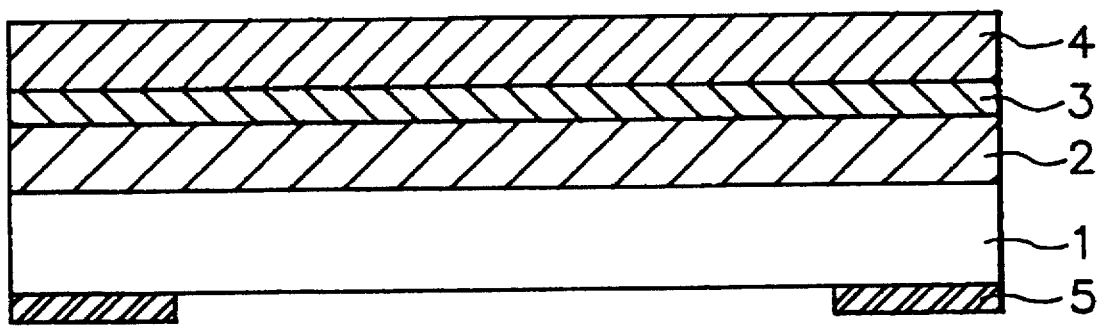
FIGS. 1A to 1B are sectional views illustrating fabrication process of bottom emitting laser diodes according to a first preferred embodiment of the present invention.
Figure 1B:
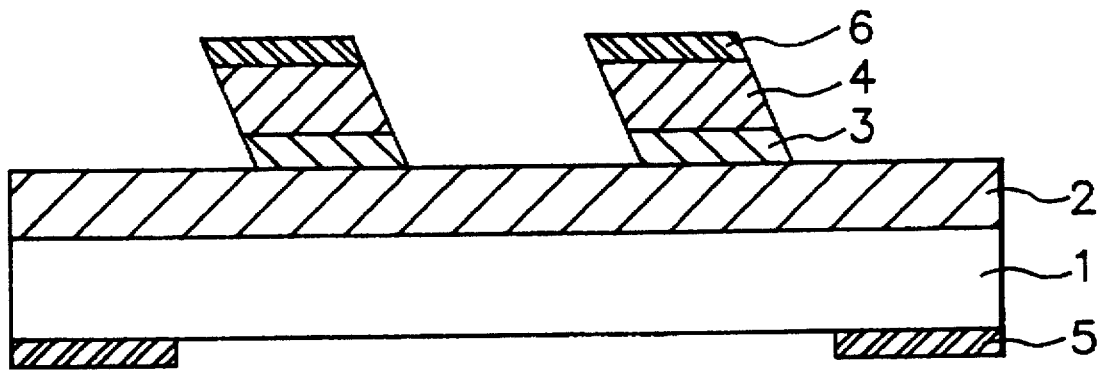

FIGS. 1A to 1B are sectional views illustrating a fabrication process of bottom emitting laser diodes according to a first preferred embodiment of the present invention.

Referring to FIG. 1A, a bottom mirror layer 2, an active layer 3 and a top mirror layer 4 are formed in turn on a GaAs substrate 1, a conductive metal is deposited, and the conductive metal is patterned by photolithography, thereby forming an n-type electrode 5.

Next, referring to FIG. 1B, a metal layer of two layers is formed by depositing Au having a thickness of 1000 to 5000 angstroms and Ni having a thickness of 500 to 2000 angstroms on the mirror layer 4 in turn as an etching mask material.

A metal mask pattern 6 is formed by patterning the metal layer by photolithography.

Figure 5A:
FIGS. 5A and B illustrate respectively rotation of the substrate about the [110] and [1̄10] directions respectively during etching.
Figure 5A:
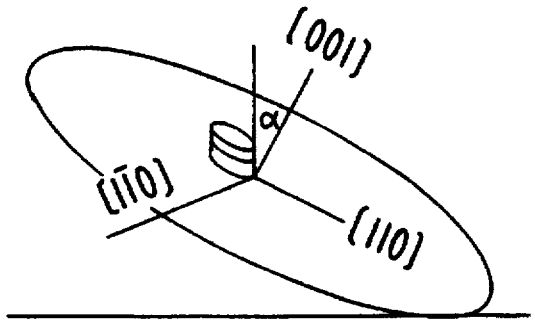

The exposed top mirror layer 4 and the active layer 3 are etched by reactive ion etching or ion beam etching after being tilted at an angle α, as illustrated in FIGS. 5A and B and 6A and B as described below, of 5 to 45 degrees in a direction of [110] or [1$\bar{1}$0] relative to an ion beam direction using the metal mask pattern 6 as an etching mask for a bottom formation material thereof.

A second preferred embodiment of the present invention will be explained hereinafter with reference to accompanying drawings.

FIGS. 2A to 2D are sectional views illustrating fabrication process of top emitting laser diodes according to a second preferred embodiment of the present invention.

Figure 2A:
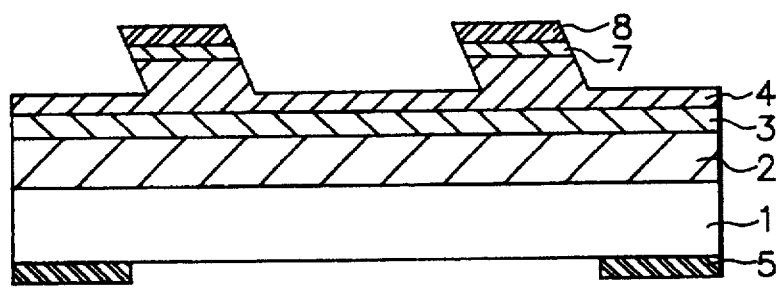
FIGS. 2A to 2D are sectional views illustrating fabrication process of top emitting laser diodes according to a second preferred embodiment of the present invention.

Referring to FIG. 2A, a bottom mirror layer 2, an active layer 3 and a top mirror layer 4 are formed in turn on a GaAs substrate 1.

A conductive metal is deposited on a rear surface of the GaAs substrate 1, the conductive metal is patterned by photolithography, and thereby an n-type electrode 5 is formed.

A protection layer 7 is formed on the top mirror layer 4 as a silicon nitride layer or an oxide layer having a thickness of 500 to 2000 angstroms, a photoresist is formed thereon, and the same is exposed to light and developed, thereby a photoresist pattern 8 having a predetermined width is formed.

The exposed protection layer 7 using the photoresist pattern 8 as the etching mask is removed by the reactive ion etching using fluorine compound gas, and is patterned.

A portion of the top mirror layer 4 is etched by the reactive ion etching or the ion beam etching after being tilted at the angle α of 5 to 45 degrees in the direction of [110] or [1$\bar{1}$0] relative to the ion beam direction, thereby making the top mirror layer 4 having a predetermined thickness remain on the active layer 3.

At this time, to make the top mirror layer 4 remain on the active layer 3 an electrode is formed for current injection.

Figure 2B:
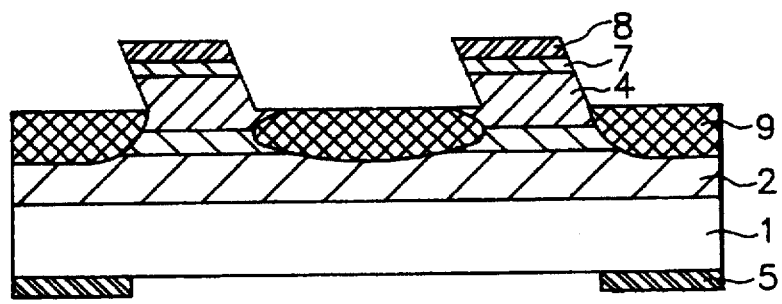

Referring to FIG. 2B, to fabricate a hole for current injection, an ion implanted depth in which maximum damage to the crystal lattice occurs is determined just on the active layer 3 or in the active layer 3 without electric doping such as protons or boron ions using the photoresist pattern 8 and the protection film 7 as the ion-implanted mask, and a dopant is implanted to an ion density that provides an insulation effect by the damage to the crystal lattice thereby forming an ion-implanted region on the active layer 3 which is not shielded by the photoresist pattern 8.

Figure 2C:
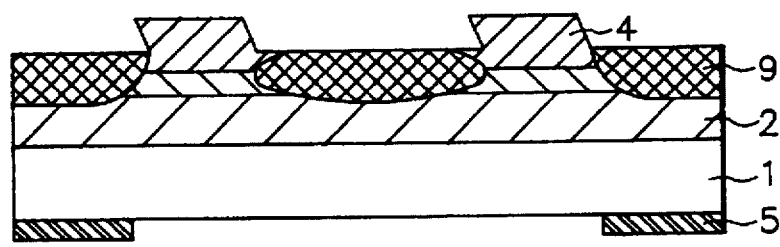

Referring to FIG. 2C, the photoresist pattern 8 and the protection layer 7 remaining on an upper surface of the top mirror layer 4 are removed in turn.

Figure 2D:
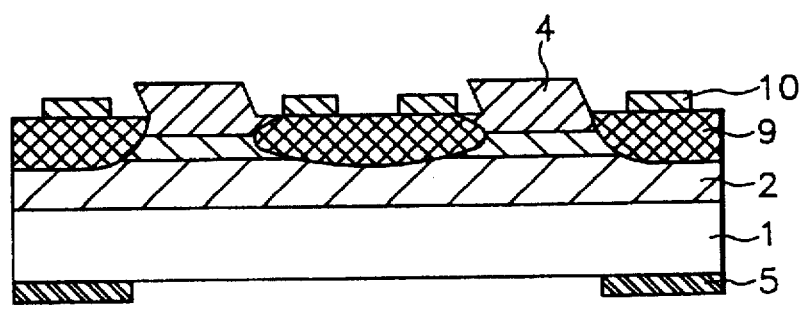

Referring to FIG. 2D, the conductive metal is deposited on whole surfaces of the top mirror layer 4 and the ion-implanted region 9, a conductive metal layer is patterned by the photolithography, thereby forming a p-type electrode pad 10 on the ion-implanted region 9.

As described above, the polarization aligned electric field in the direction of [110] is emitted dominantly when the cavity is etched in the direction of the [1$\bar{1}$0], and the polarization aligned electric field in the direction of [1$\bar{1}$0] when cavity is etched in the direction of [110].

An etching angle and an etching depth are determined according to a size of devices to control the polarization as above.

Figure 3:
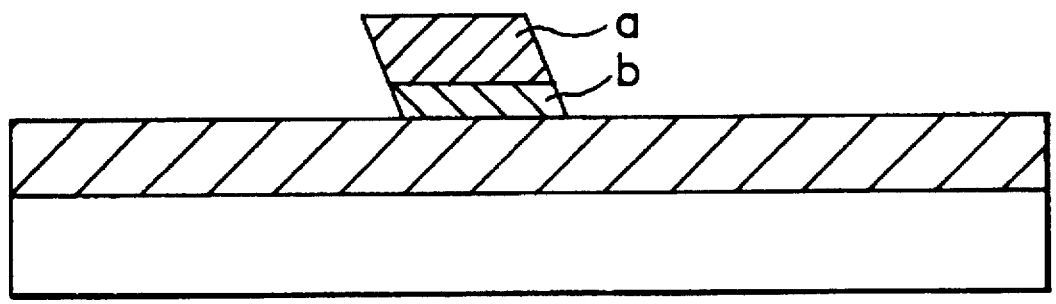
FIG. 3 is a side view illustrating a surface-emitting laser diode according to a preferred embodiment of the present invention.
Figure 4:
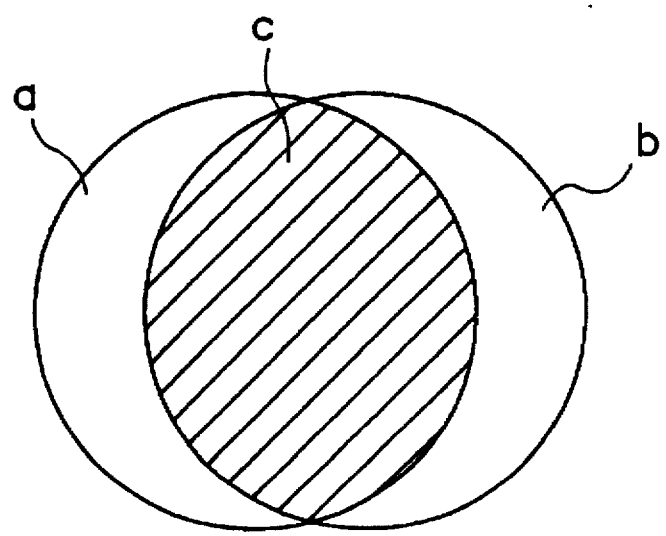
FIG. 4 is a plan view illustrating overlapping of a top mirror layer and an active layer of a surface-emitting laser diode according to a preferred embodiment of the present invention.

Taking as an example a laser diode having a circular section in the etching angle and depth, a ratio of an overlapped area c to a minimum lateral section is less than 90 percent where the upper surface of the top mirror layer is a and the lower surface of the active layer is b as illustrated in FIGS. 3 and 4.

To satisfy the above ratio, the smaller the cross sectional are of the laser diode, the greater the etching angle or the deeper the etching depth.

The minimum angle of 5 degrees corresponds to a laser diode having a diameter of less 3 nanometers, and the angle of 45 degrees is a maximum angle in which a plane surface can be obtained in the ion beam etching.

As described above, the present invention provides the fabrication method of the surface-emitting laser diode which can easily control polarization in the desired direction by etching the cavity after tilting toward the direction of [110] or [1$\bar{1}$0] while maintaining circularity of the output beam. The gain of orthogonal polarizations becomes different between the parallel and perpendicular direction relative to the tilting direction in the plane.

A gain of the polarization formed perpendicular about the tilted directions [110] or [1$\bar{1}$0] relatively higher, whereby the polarization to this direction is dominantly emitted.

Figure 5B:
Figure 5B:
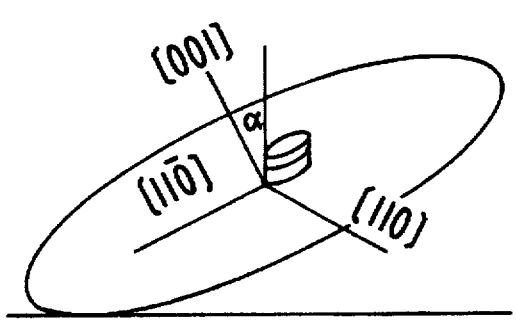

FIGS. 5A and 5B illustrate respectively the etching of the laser by rotating the substrate and additional layers as illustrated in FIG. 1 from which the laser is fabricated respectively about the [110] and [1$\bar{1}$0] directions to form an angle α as measured between the sidewall and the direction [001]. The angle α is measured between the sidewall produced by etching with the beam and the [001] direction.

Figure 6A:
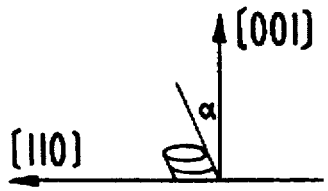
FIGS. 6A and 6B illustrate the resultant diode in the [110] and [1̄10] directions after etching.
Figure 6B:
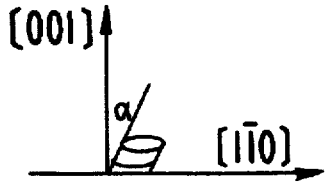

FIGS. 6A and 6B illustrate respectively schematically the resultant lasers which are obtained after etching with sidewalls inclined from the vertical at the angle α measured relative to the [001] direction.

Other embodiments of the invention will be apparent to the skilled in the art from consideration of the specification and practice of the invention disclosed herein. It is intended that the specification and examples be considered as exemplary only, with the true scope and spirit of the invention defined by the claims.

What is claimed is:

1. A fabrication method of a laser which emits light from an emitting surface having a sidewall which is inclined with respect to a normal to the emitting surface comprising:

providing an ion beam for etching the sidewall of the laser; and providing a semiconductor substrate having a face which is formed into the emitting surface with the face being intercepted by the ion beam and the substrate being tilted about either a [110] or a [1$\bar{1}$0] direction and forming an angle of 5° and 45° between a [001] direction and the sidewall.

2. A fabrication method of a polarization controlled surface emitting laser of a bottom emitting type having a sidewall inclined with respect to a normal to a surface of the laser comprising:

forming a bottom mirror layer, an active layer and a top mirror layer on a semiconductor substrate;

forming a patterned metal layer on the top mirror layer as an etching mask;

providing an ion beam for etching the top mirror layer and the active layer; and positioning the top mirror layer and the active layer in the ion beam to cause the ion beam to etch the top mirror layer and the active layer to form the inclined sidewall with a face of the substrate being rotated about either one of a [110] or a [1$\bar{1}$0] direction and forming an angle ranging between 5° and 45° measured between the inclined sidewall and a [001] direction while using the patterned metal layer as an etching mask.

3. A fabrication method in accordance with claim 2 wherein:

the patterned metal layer comprises two layers formed by depositing Au having a thickness of 1000 to 5000 angstroms and Ni having a thickness of 500 to 2000 angstroms on the top mirror layer.

4. A fabrication method of a polarization controlled surface emitting layer of a top emitting type having a sidewall inclined with respect to a normal to a surface of the laser comprising:

forming a bottom mirror layer, an active layer and a top mirror layer and a protection film on a semiconductor substrate;

forming a photoresist pattern on the protection film;

etching the protection film using the photoresist pattern as a mask;

providing an ion beam for etching an exposed portion of the top mirror layer;

etching the exposed portion of the top mirror layer within the ion beam to form the inclined sidewall with a face of the substrate being rotated about either one of a [110] or a [1$\bar{1}$0] direction and forming an angle ranging between 5° and 45° measured between the inclined sidewall and a [001] direction while using the photoresist pattern and the etched protection as an etching mask; and forming an ion implanted region in the active layer by ion implantation using the photoresist pattern and the etched protection film as an ion implantation mask.

* * * * *